(12) United States Patent
Francis

(10) Patent No.: US 8,581,853 B2
(45) Date of Patent: Nov. 12, 2013

(54) TWO ELEMENT SLIDER WITH GUARD SENSOR

(75) Inventor: Mark Francis, Toronto (CA)

(73) Assignee: Cypress Semiconductor Corp., San Jose, CA (US)

( * ) Notice: Subject to any disclaimer, the term of this patent is extended or adjusted under 35 U.S.C. 154(b) by 1469 days.

(21) Appl. No.: 12/009,529

(22) Filed: Jan. 18, 2008

(65) Prior Publication Data

US 2009/0184920 A1    Jul. 23, 2009

Related U.S. Application Data

(60) Provisional application No. 60/948,959, filed on Jul. 10, 2007.

(51) Int. Cl.
*G06F 3/041* (2006.01)

(52) U.S. Cl.
USPC .................. 345/173; 345/156; 178/18.06

(58) Field of Classification Search
USPC ............ 345/156, 168–184; 178/18.01–18.08, 178/19.01–19.05
See application file for complete search history.

(56) References Cited

U.S. PATENT DOCUMENTS

| | | | |
|---|---|---|---|
| 4,264,903 A * | 4/1981 | Bigelow ............................ | 341/1 |
| 4,659,874 A * | 4/1987 | Landmeier ................. | 178/18.03 |
| 4,999,462 A * | 3/1991 | Purcell ....................... | 178/18.03 |
| 6,346,818 B2 * | 2/2002 | Wilson et al. ................. | 324/658 |
| 6,535,200 B2 * | 3/2003 | Philipp ......................... | 345/168 |
| 7,733,333 B2 * | 6/2010 | Kaliher ......................... | 345/173 |
| 7,812,825 B2 * | 10/2010 | Sinclair et al. ................ | 345/173 |
| 7,973,771 B2 | 7/2011 | Geaghan | |
| 8,089,472 B2 * | 1/2012 | XiaoPing et al. ............. | 345/173 |
| 2004/0252109 A1 * | 12/2004 | Trent et al. .................... | 345/174 |
| 2005/0007349 A1 * | 1/2005 | Vakil et al. .................... | 345/173 |
| 2005/0035956 A1 * | 2/2005 | Sinclair et al. ................ | 345/184 |
| 2005/0062732 A1 * | 3/2005 | Sinclair et al. ................ | 345/184 |
| 2005/0156881 A1 * | 7/2005 | Trent et al. .................... | 345/157 |
| 2006/0016800 A1 * | 1/2006 | Paradiso et al. ............... | 219/497 |
| 2007/0008299 A1 * | 1/2007 | Hristov ......................... | 345/173 |
| 2007/0242057 A1 * | 10/2007 | Zadesky et al. ............... | 345/173 |
| 2007/0257894 A1 * | 11/2007 | Philipp ......................... | 345/173 |
| 2007/0262963 A1 * | 11/2007 | Xiao-Ping et al. ............ | 345/173 |
| 2007/0268266 A1 * | 11/2007 | XiaoPing ...................... | 345/173 |
| 2008/0001926 A1 * | 1/2008 | XiaoPing et al. ............. | 345/173 |
| 2008/0074398 A1 * | 3/2008 | Wright ......................... | 345/173 |
| 2008/0136792 A1 * | 6/2008 | Peng et al. .................... | 345/174 |
| 2008/0196945 A1 * | 8/2008 | Konstas ..................... | 178/18.03 |

* cited by examiner

*Primary Examiner* — Dmitriy Bolotin

(57) ABSTRACT

A method for using a slider-based capacitive sensor to implement a user interface having discrete buttons. Button locations are designated on a slider-based capacitive sensor having at least two conductive traces such that a user input at any button location results in a capacitance change in the conductive traces. Locations of inputs are distinguishable by ratios between the capacitance changes of the conductive traces, which can be correlated to a particular button location. Ratio ranges corresponding to areas covered by each button are used to identify which button has received an input.

18 Claims, 9 Drawing Sheets

TWO ELEMENT SLIDER WITH GUARD SENSOR

TECHNICAL FIELD

This application claims priority to U.S. Provisional Application No. 60/948,959, filed Jul. 10, 2007.

This invention relates to the field of user interface devices and, in particular, to capacitive touch-sensor devices.

BACKGROUND

In general, capacitive touch sensors are intended to replace mechanical buttons, knobs, and other similar mechanical user interface controls. Capacitive sensors allow the elimination of complicated mechanical switches and buttons and provide reliable operation under harsh conditions. Also, capacitive sensors are widely used in modern consumer applications, providing new user interface options in the existing products.

The capacitance detected by a capacitive sensor changes as a function of the proximity of a conductive object to the sensor. The conductive object can be, for example, a stylus or a user's finger. In a touch-sensor device, a change in capacitance of the sensor array due to the proximity or movement of a conductive object can be measured by a variety of methods. Regardless of the method, usually an electrical signal representative of the capacitance detected by each capacitive sensor is processed by a processing device.

FIG. 1 illustrates a layout for conductive traces in a conventional capacitive sensor having five touch-sensor buttons. Capacitive sensor 100 includes button 101, button 102, button 103, button 104, and button 105, which correspond to button locations 1, 2, 3, 4, and 5, respectively. These buttons may be capacitive touch-sensor buttons and may be used for user input using a conductive object, such as a finger or stylus. For example, each of the five button locations may be assigned to a different function so that when an input is detected at one button location, the processing device detecting the input performs the function associated with that button location. In a capacitive sensor having five buttons, such as capacitive sensor 100, a processing device connected to the sensor may be required to monitor five different capacitance signals, one capacitance signal for each button location, in order to determine whether and when an input has been received at any one of the button locations.

BRIEF DESCRIPTION OF THE DRAWINGS

The present invention is illustrated by way of example, and not by way of limitation, in the figures of the accompanying drawings.

DETAILED DESCRIPTION

Described herein is a method and apparatus for detecting a presence and location of a user input on a capacitive sensor. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment of the present invention, a capacitive sensor array having two conductive traces and a guard sensor trace may be used to discriminate between five possible user input locations. In one embodiment, a ratio between capacitance values measured from the capacitive sensor array may be used to discriminate between user input locations. For example, each possible user input location may be correlated with a range of ratios so that a ratio of measured capacitance values falling within a particular range indicates a user input at the location correlated with that range. This method for discriminating between user input locations may be used with a variety of capacitive sensor array configurations and may be implemented in an electronic system.

Figure 1:
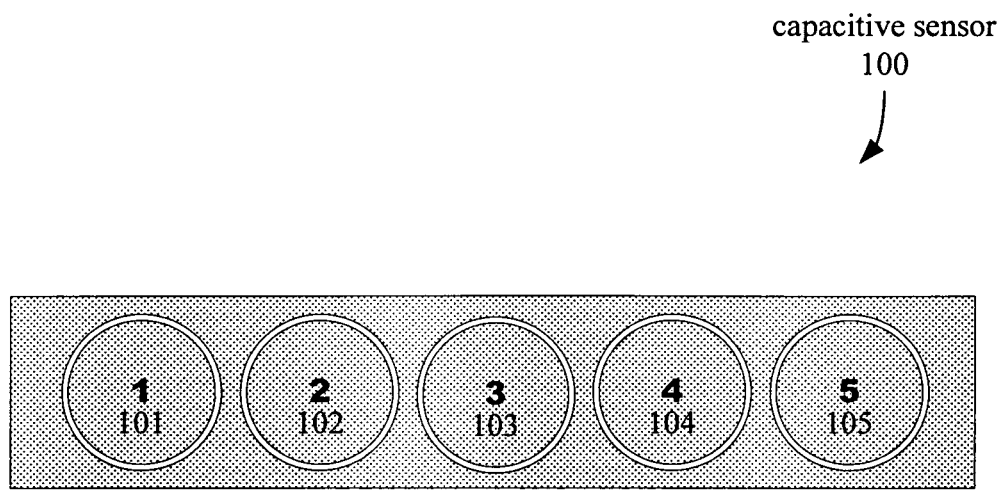
FIG. 1 illustrates a layout for conductive traces in a conventional five-button capacitive sensor.
Figure 2:
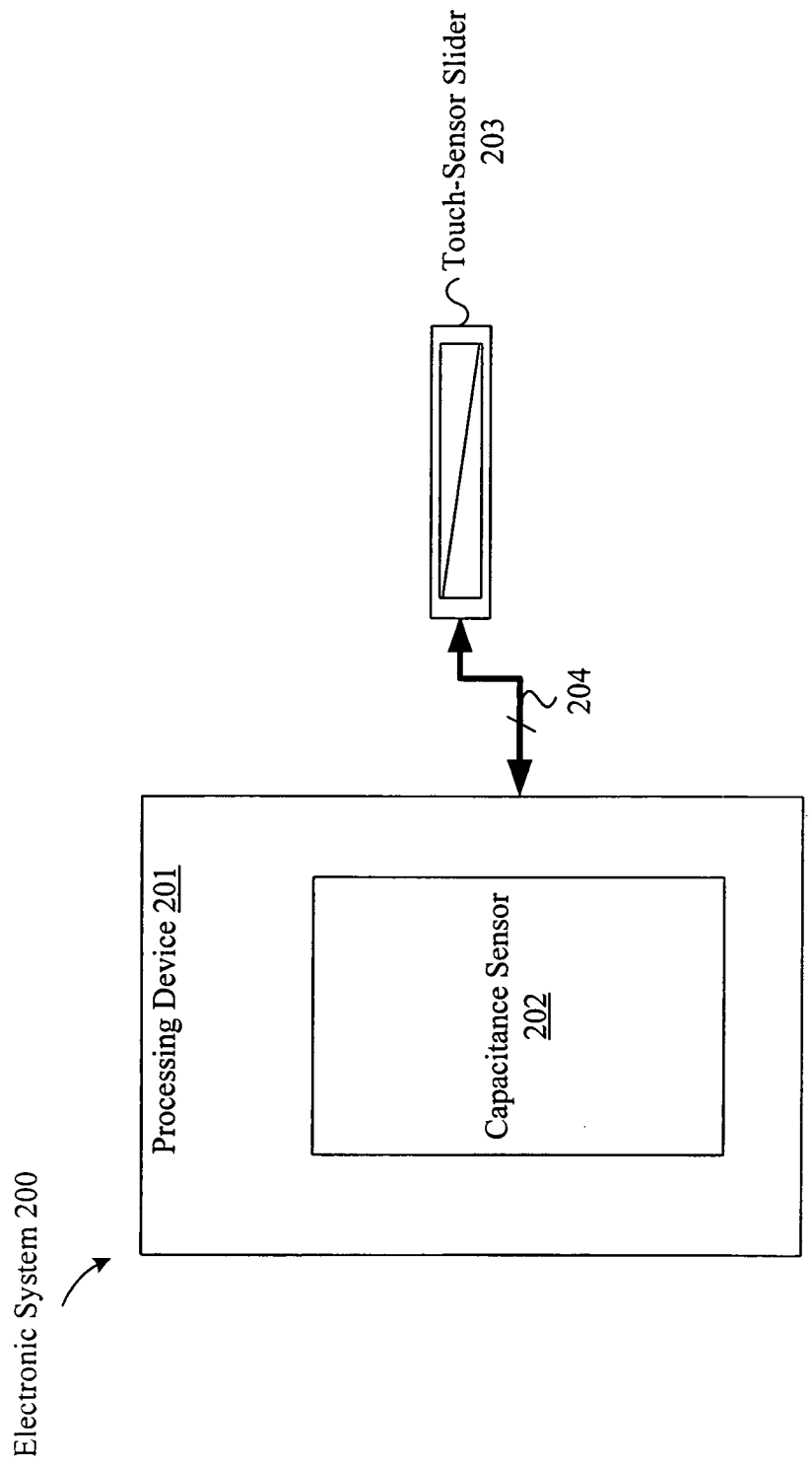
FIG. 2 is a block diagram illustrating one embodiment of an electronic system having a processing device for detecting the presence of a conductive object on a capacitive sensor.

FIG. 2 illustrates a block diagram of one embodiment of an electronic system 200 having a processing device 201 for detecting a presence of a conductive object. Electronic system 200 includes processing device 201, capacitance sensor 202, touch-sensor slider 203, and bus 204.

As illustrated, capacitance sensor 202 may be integrated into processing device 201. Capacitance sensor 202 may include analog I/O for coupling to an external component, such as touch-sensor slider 203, and/or other devices. In one embodiment, the electronic system 200 includes touch-sensor slider 203 coupled to the processing device 201 via bus 204. Touch-sensor slider 203 may include a capacitive sensor array. The sensor array may include a number of conductive traces configured so that the capacitance of each conductive trace may be measured independently of the others.

Processing device 201 may reside on a common carrier substrate such as, for example, an integrated circuit (IC) die substrate, a multi-chip module substrate, or the like. Alternatively, the components of processing device 201 may be one or more separate integrated circuits and/or discrete components. In one embodiment, processing device 201 may be a Programmable System on a Chip (PSoC™) processing device, manufactured by Cypress Semiconductor Corporation, San Jose, Calif. Alternatively, processing device 201 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like.

In one embodiment, capacitance sensor 202 performs the function of measuring capacitances from touch sensor slider 203. Capacitance sensor 202 may be integrated into the IC of the processing device 201, or alternatively, in a separate IC. Alternatively, descriptions of capacitance sensor 202 may be generated and compiled for incorporation into other integrated circuits. For example, behavioral level code describing capacitance sensor 202, or portions thereof, may be generated using a hardware descriptive language, such as VHDL or Verilog, and stored to a computer-accessible medium (e.g., CD-ROM, hard disk, floppy disk, etc.). Furthermore, the behavioral level code can be compiled into register transfer level ("RTL") code, a netlist, or even a circuit layout and stored to a computer-accessible medium. The behavioral level code, the RTL code, the netlist, and the circuit layout all represent various levels of abstraction to describe capacitance sensor 202.

It should be noted that the components of electronic system 200 may include all the components described above. Alternatively, electronic system 200 may include only some of the components described above.

In one embodiment, electronic system 200 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

Figure 3A:
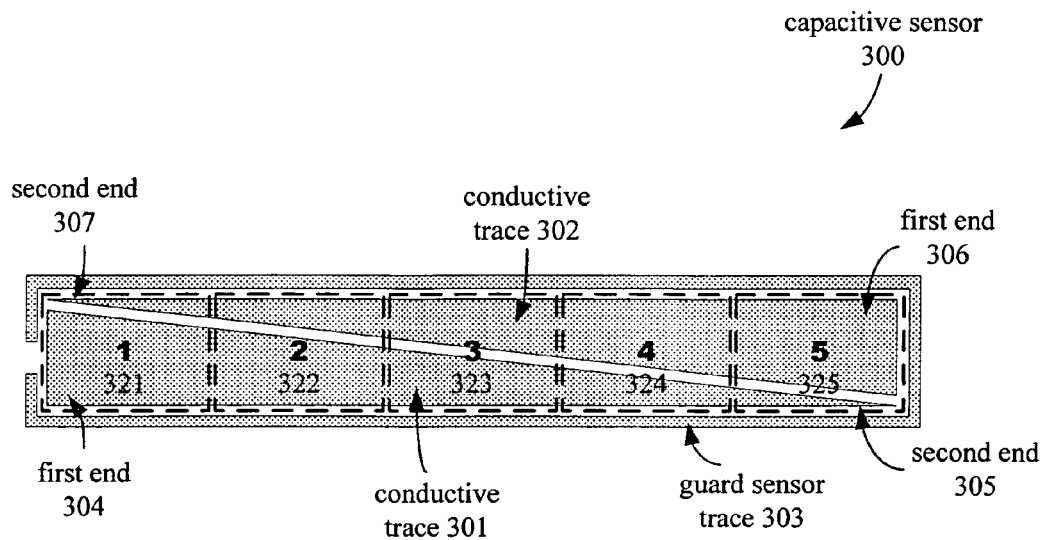
FIG. 3A illustrates a layout for conductive traces in a slider-based capacitive sensor with five button locations.

FIG. 3A illustrates a layout for conductive traces in a slider-based capacitive sensor having five button locations according to one embodiment of the invention. In one embodiment, capacitive sensor 300 may be connected with processing device 201 in a similar manner as touch sensor slider 230. As illustrated in FIG. 3A, capacitive sensor 300 includes conductive trace 301, conductive trace 302, and guard sensor trace 303. Conductive trace 301 also includes a first end 304 and a second end 305. Conductive trace 302 includes a first end 306 and a second end 307. FIG. 3A also illustrates the positions of buttons 321, 322, 323, 324, and 325, which correspond to button locations 1, 2, 3, 4, and 5, respectively.

As illustrated in FIG. 3A, conductive trace 301 is in the shape of a triangle having a first end 304 and a second end 305. Conductive trace 301 decreases gradually in width from its first end 304 to its second end 305 so that conductive trace 301 has greater surface area near the first end 304 than near the second end 305. Conductive trace 302, in this embodiment, is also triangular in shape, having a first end 306 and a second end 307. Conductive trace 302 may also have a greater surface area near its first end 306 than near its second end 307. In alternative embodiments, one or both of conductive traces 301 and 302 may not be triangular in shape, but may be some other shape having a greater surface area near one end than near the other end. Conductive trace 301 is positioned alongside conductive trace 302 so that the first end 304 of conductive trace 301 is adjacent to the second end 307 of conductive trace 302. Conductive trace 301 may also be positioned alongside conductive trace 302 so that the second end 305 of conductive trace 301 is adjacent to the first end 306 of conductive trace 302.

In one embodiment, the geometry of conductive traces 301 and 302 is designed so that for each of buttons 321, 322, 323, 324, and 325, the ratio of the surface areas of conductive traces 301 and 302 covered by the button area is different than for any of the other buttons. For example, button 321 corresponding to button location 1 covers a much larger portion of conductive trace 301 than of conductive trace 302. In contrast, button 323 corresponding to button location 3 covers equal portions of conductive trace 301 and conductive trace 302, while button 325 corresponding to button location 5 covers a much greater portion of conductive trace 302 than of conductive trace 301. Button 322 has a surface area ratio intermediate between buttons 321 and 323, while button 324 has a surface area ratio intermediate between buttons 323 and 325.

In one embodiment, a user applying an input through button 321 may cause a greater change in the capacitance of conductive trace 301 than in the capacitance of conductive trace 302 because of the greater surface area of conductive trace 301 covered by button 321. A user applying an input to button 323 may cause an approximately equal change in the capacitances of conductive traces 301 and 302 because equal surface areas of conductive traces 301 and 302 are covered by button 323. Thus, in one embodiment, the different surface area ratios associated with each button result in different capacitance change ratios when inputs are applied to the buttons. The difference in capacitance change ratios can be detected and used to determine to which of the buttons the input was applied.

Figure 3B:
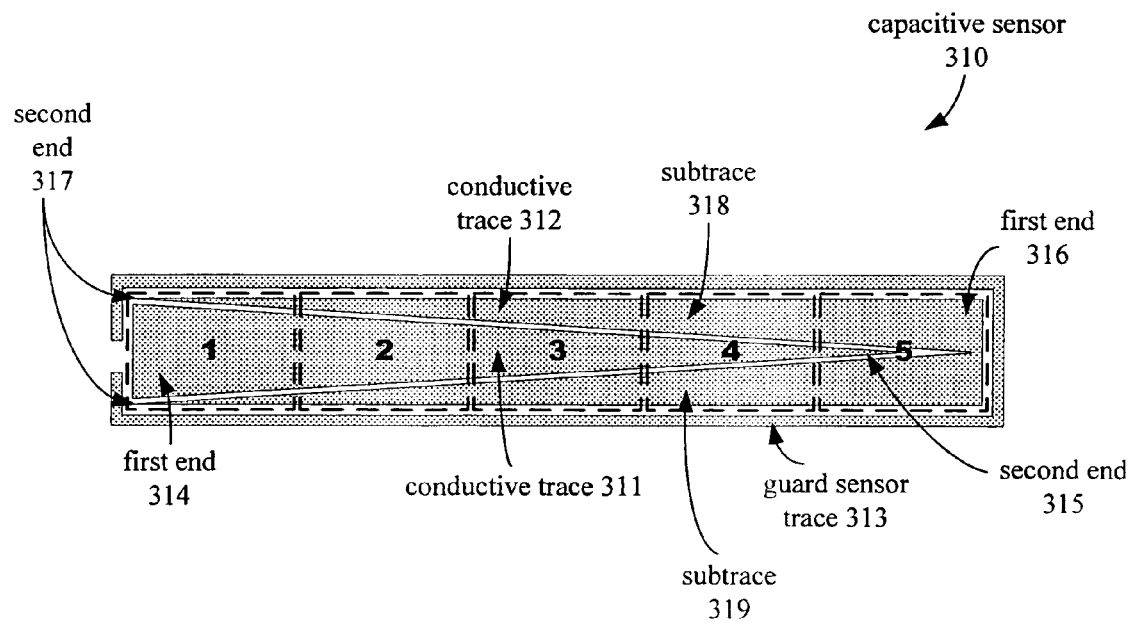
FIG. 3B illustrates a layout for conductive traces in a slider-based capacitive sensor with five button locations.
Figure 3C:
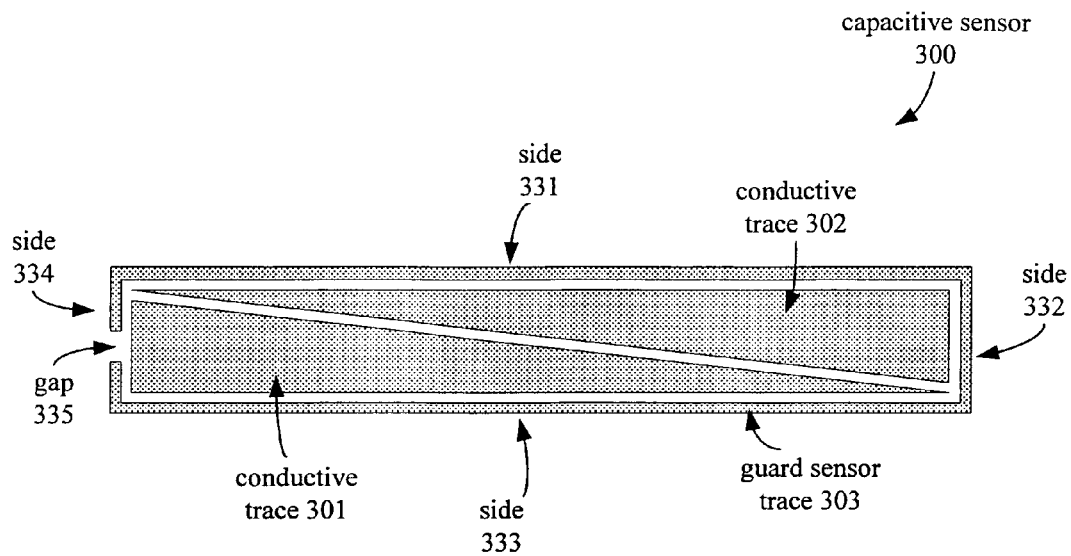
FIG. 3C illustrates a layout for conductive traces in a slider-based capacitive sensor with five button locations having a guard sensor trace along four sides.

In one embodiment, conductive trace 301 and conductive trace 302 may be at least partially surrounded by guard sensor trace 303. In one embodiment, guard sensor trace 303 almost completely surrounds conductive trace 301 and conductive trace 302. A configuration of a guard sensor trace according to one embodiment of the invention is illustrated in FIG. 3C. In FIG. 3C, capacitive sensor 300 includes conductive traces 301 and 302, and guard sensor trace 303, which has a gap 335. Capacitive sensor 300 has four sides, sides 331, 332, 333, and 334. In one embodiment, as illustrated in FIG. 3C, guard sensor trace 303 is positioned so that a portion of guard sensor trace 303 is situated alongside each of sides 331, 332, 333, and 334. In this configuration, guard sensor trace 303 substantially surrounds conductive traces 301 and 302. In one embodiment, as illustrated in FIG. 3C, the portion of guard sensor trace 303 that is positioned alongside side 334 has a gap 335. Gap 335 may be used for the purpose of routing traces connected to conductive traces 301 and 302. In other embodiments, gap 335 may be located at any of sides 331, 332, 333, or 334. In other embodiments, gap 335 may not be present.

Figure 3D:
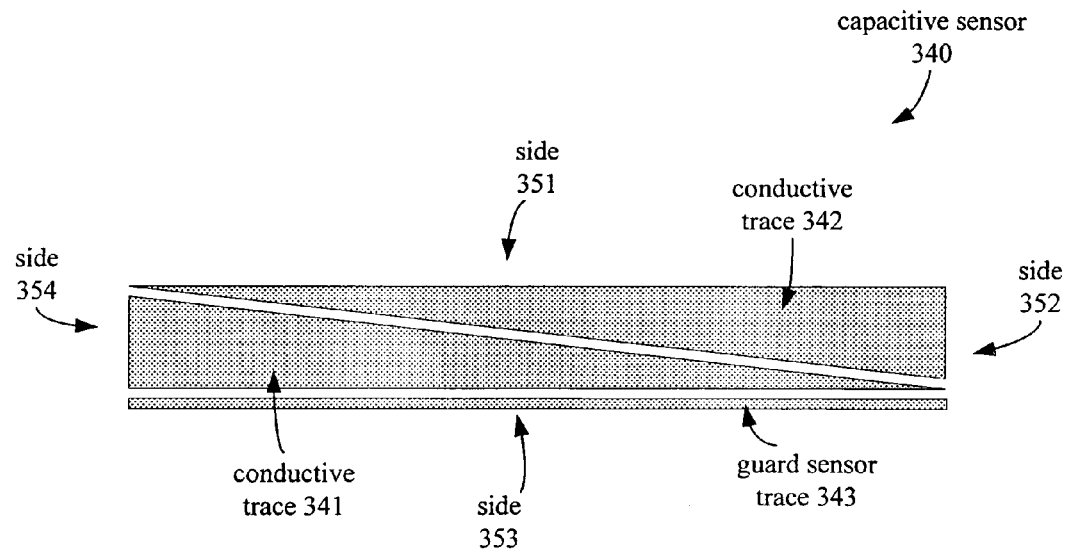
FIG. 3D illustrates a layout for conductive traces in a slider-based capacitive sensor with five button locations having a guard sensor along only one side.

FIG. 3D illustrates a configuration of a guard sensor according to one embodiment of the invention. As illustrated in FIG. 3D, capacitive sensor 340 includes conductive traces 341 and 342, and guard sensor trace 343. Capacitive sensor 340 has four sides, sides 351, 352, 353, and 354. In one embodiment of the present invention, guard sensor trace 343 is situated alongside only side 353, while no portion of guard sensor trace 343 is positioned alongside sides 351, 352, or 354. In this configuration, guard sensor trace 343 may be less effective, yet still functional, for rejecting signals that were not intended to be inputs than a guard sensor trace having a portion of its area positioned alongside more than one of the sides 351, 352, 353, or 354. According to other embodiments of the invention, portions of the guard sensor trace 343 may be positioned alongside any combination of sides 351, 352, 353, and 354 or portions of sides 351, 352, 353, and 354. For example, guard sensor trace 343 may be positioned only along sides 351 and 353, or guard sensor trace 343 may be positioned only along sides 352, 353, and 354. For further example, guard sensor trace 343 may be positioned along only a portion of side 353 and a portion of sides 354 and 352.

In one embodiment, guard sensor trace 303 is positioned so that user actions causing capacitance changes on conductive traces 301 or 302 that are not intended to be inputs will also cause a capacitance change on the guard sensor trace 303. Guard sensor trace 303 may also be positioned so that user actions that are intended to be inputs do not cause a significant change in the capacitance of guard sensor trace 303. In one embodiment, the change in capacitance of the guard sensor trace 303 resulting from a user action is compared with the change in capacitance of one or both of conductive traces 301 or 302 to determine whether the user action was intended to be an input. For example, with regard to FIG. 3A, button 321 may be designed to match the size of a user's fingertip so that the user's fingertip must be centered over button 321 to avoid covering a portion of guard sensor trace 303. A user's fingertip placed over the center of button 321, for example, may increase the capacitances of conductive traces 301 and 302 but may not significantly affect the capacitance of the guard sensor trace 303. A processing device such as processing device 210 that is connected to the capacitive sensor 300 may then determine that the placement of the fingertip was centered over button 321 and was intended as an input. In contrast, a fingertip placed off-center over button 321 may cause a significant increase in the capacitance of guard sensor trace 303, which processing device 210 can then use as a basis for rejecting the user action as an unintentional input. Processing device 210 may make this determination by comparing the change in capacitance of the guard sensor trace 303 with the change in capacitance of one or both of conductive traces 301 or 302.

The principles of operation described above with regard to capacitive sensor 300 may also apply, in other embodiments, to capacitive sensors having geometries different from capacitive sensor 300. For instance, FIG. 3B illustrates, according to one embodiment, an alternative layout for conductive traces in a slider-based capacitive sensor having five button locations, where one conductive trace in the capacitive sensor includes two subtraces. In one embodiment, capacitive sensor 310 may be connected with processing device 201 in a similar manner as touch sensor slider 230. As illustrated in FIG. 3B, capacitive sensor 310 includes conductive trace 311, conductive trace 312, and guard sensor trace 313. Conductive trace 311 also includes a first end 314 and a second end 315. Conductive trace 312 includes a first end 316 and a second end 317. Conductive trace 312 also includes subtrace 318 and subtrace 319.

As illustrated in FIG. 3B, conductive trace 311 is in the shape of a triangle having a first end 314 and a second end 315. Conductive trace 311 has greater surface area near the first end 314 than near the second end 315. In one embodiment, conductive trace 311 may not be triangular in shape, but may be some other shape having a greater surface area near one end than near the other end. Conductive trace 312 may also have a greater surface area near its first end 316 than near its second end 307. Conductive trace 312, in one embodiment, is composed of at least two subtraces such as subtrace 318 and subtrace 319. Conductive trace 301 may be interleaved between subtrace 318 and subtrace 319 of conductive trace 312 so that the first end 314 of conductive trace 311 is adjacent to the second end 317 of conductive trace 312. Conductive trace 311 may also be positioned with respect to conductive trace 312 so that the second end 315 of conductive trace 311 is adjacent to the first end 316 of conductive trace 312. In one embodiment, conductive trace 312 may include more than two subtraces. In one embodiment, conductive trace 311 may also include two or more subtraces. In an embodiment where conductive trace 311 and conductive trace 312 each have at least two subtraces, the subtraces may be interleaved between each other such that the subtraces of conductive trace 311 alternate with the subtraces of conductive trace 312.

In one embodiment, conductive trace 311 and conductive trace 312 may be surrounded by guard sensor trace 313. In one embodiment, guard sensor trace 313 almost completely surrounds conductive trace 311 and conductive trace 312, as illustrated in FIG. 3B. In another embodiment, at least part of guard sensor trace 313 may be positioned alongside one or both of conductive trace 311 or conductive trace 312. In one embodiment, guard sensor trace 313 is positioned so that user actions causing capacitance changes on conductive traces 311 or 312 that are not intended to be inputs will also cause a capacitance change on the guard sensor trace 313. Guard sensor trace 313 may also be positioned so that user actions that are intended to be inputs do not cause a significant change in the capacitance of guard sensor trace 313.

Figure 4:
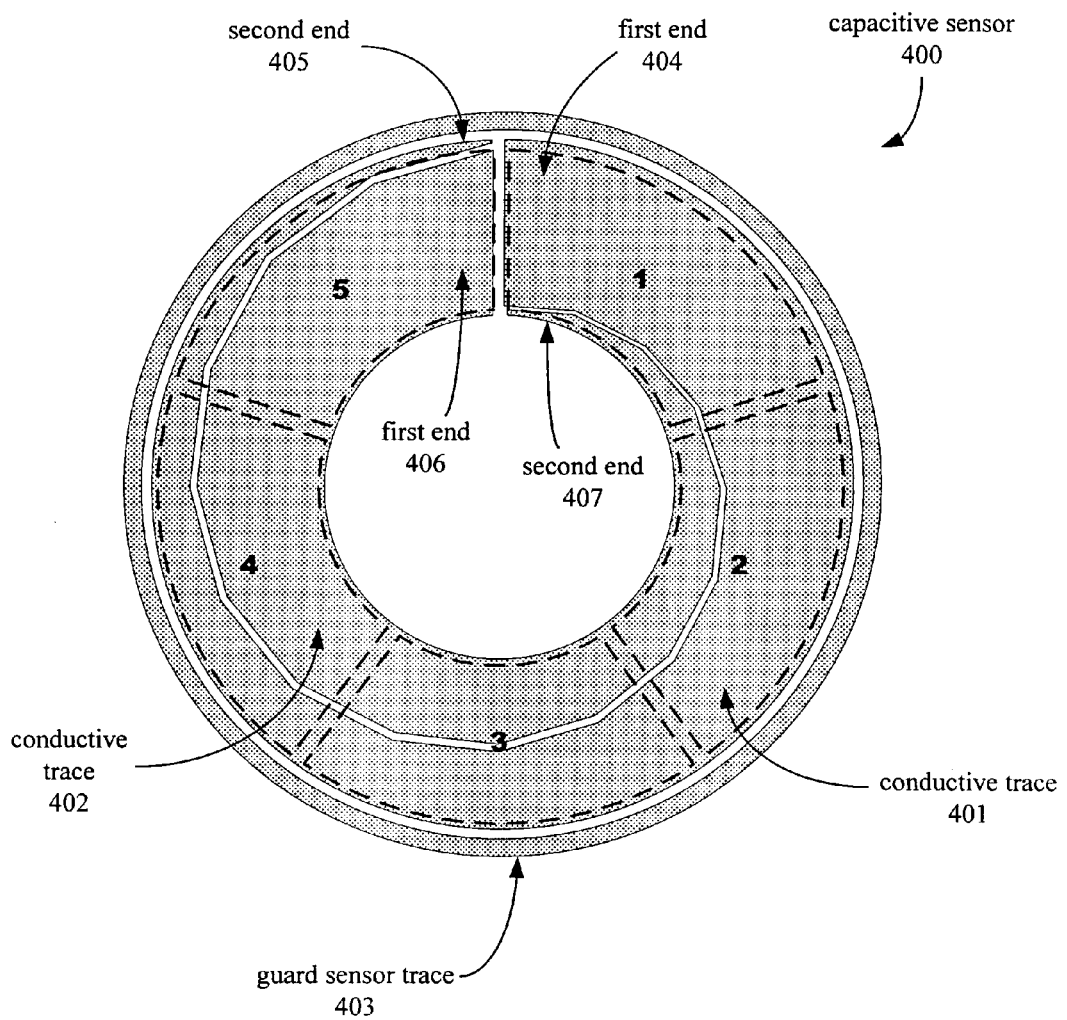
FIG. 4 illustrates a circular layout for conductive traces in a slider-based capacitive sensor with five button locations.

FIG. 4 illustrates a layout for conductive traces in a capacitive sensor having five button locations where the conductive traces are curved along the circumference of a circle according to an alternative embodiment of the present invention. Capacitive sensor 400, as illustrated in FIG. 4, includes conductive trace 401, conductive trace 402, and guard sensor trace 403. Conductive trace 401 has a first end 404 and a second end 405. Conductive trace 402 has a first end 406 and a second end 407. While in one embodiment conductive traces 401 and 402 may be curved along the circumference of a circle, conductive traces 401 and 402 may in other embodiments follow other curves or the perimeters of other shapes. For example, conductive traces 401 and 402 may follow the curve of an ellipse or the perimeter of a polygon such as a hexagon.

As illustrated in FIG. 4, conductive trace 401 is in the shape of a triangle that is curved along the circumference of a circle so that its first end 404 is adjacent to its second end 405. As shown in FIG. 4, conductive trace 401 has greater surface area near the first end 404 than near the second end 405. In one embodiment, conductive trace 401 may not be triangular in shape, but may be some other shape having a greater surface area near one end than near the other end. Conductive trace 402 may also have a greater surface area near its first end 406 than near its second end 407. Conductive trace 401 may also be positioned with respect to conductive trace 402 so that the second end 405 of conductive trace 401 is adjacent to the first end 406 of conductive trace 402. In one embodiment, conductive trace 402 may include two or more subtraces. In one embodiment, conductive trace 401 may also include two or more subtraces. In an embodiment where conductive trace 401 and conductive trace 402 each have at least two subtraces, the subtraces may be interleaved between each other such that the subtraces of conductive trace 401 alternate with the subtraces of conductive trace 402.

In one embodiment, conductive trace 401 and conductive trace 402 may be surrounded by guard sensor trace 403. In one embodiment, guard sensor trace 403 completely surrounds conductive trace 401 and conductive trace 402, as illustrated in FIG. 4. In another embodiment, guard sensor trace 403 may only partially surround one or both of conductive trace 401 or conductive trace 402. In one embodiment, guard sensor trace 403 is positioned so that user actions causing capacitance changes on conductive traces 401 or 402 that are not intended to be inputs will also cause a capacitance change on the guard sensor trace 403. Guard sensor trace 403 may also be positioned so that user actions that are intended to be inputs do not cause a significant change in the capacitance of guard sensor trace 403.

In one embodiment, the patterns illustrated in FIGS. 3A, 3B, and 4 may be produced on the surface of a substrate such as a printed circuit board, glass, or other material. In one embodiment, the substrate is not necessarily rigid. Conductive traces 301, 302, 311, 312, 401, and 402 and guard sensor traces 303, 313, and 403 may be produced on the surface of the substrate using copper, a conductive polymer such as poly(3,4-ethylenedioxythiophene) (PEDOT), or some other conductive material.

Figure 5:
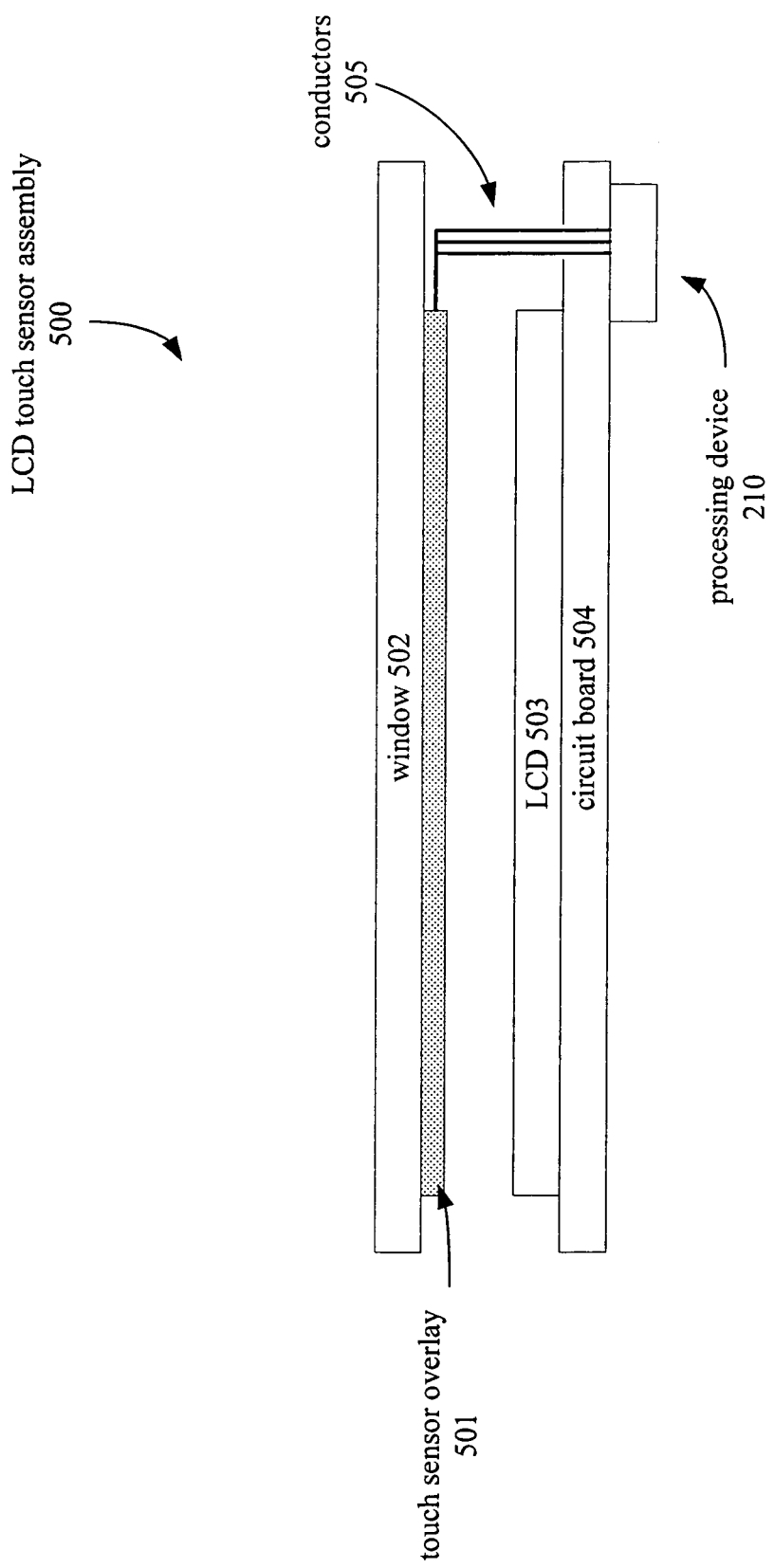
FIG. 5 illustrates one embodiment of a device that uses a capacitive touch sensor with a liquid crystal display (LCD).

FIG. 5 illustrates an assembly including a liquid crystal display (LCD) with a touch sensor overlay according to one embodiment of the present invention. LCD touch sensor assembly 500 includes touch sensor overlay 501, window 502, LCD 503, circuit board 504, conductors 505, and processing device 210.

In one embodiment, touch sensor overlay 501 may be a capacitive sensor such as capacitive sensor 300, 310, or 400. In one embodiment, touch sensor overlay 501 may be constructed from PEDOT or some other conductive polymer on a substrate of polyethylene terephthalate (PET). Touch sensor overlay 501 may be sufficiently thin so that it is substantially transparent. Thus, touch sensor overlay 501 may be laminated onto a transparent window 502. Window 502 and touch sensor overlay 501 may then be used to cover LCD 503, which may be mounted on circuit board 504. By this arrangement, LCD touch sensor assembly 500 can accept user inputs directly over the LCD 503, which may be useful for implementing features such as soft keys, or for giving feedback to a user providing the input.

Processing device 210 may also be mounted on circuit board 504 and connected to touch sensor overlay 501 through conductors 505. According to one embodiment where touch sensor overlay 501 has five button locations, the conductors 505 include only three conductive paths through which processing device 210 determines a presence of a user input and distinguishes among five possible locations for the user input. For example, touch sensor overlay 501 may include a capacitive sensor such as capacitive sensor 300, which includes conductive traces 301 and 302 and guard sensor trace 303. Thus, the conductors 505 need only to include three conductive paths to processing device 210, one from each of conductive traces 301 and 302, and guard sensor trace 303. In other embodiments, touch sensor overlay 501 may include a capacitive sensor having geometry different than that of capacitive sensor 300. In other embodiments, touch sensor overlay 501 may also implement more or fewer than five buttons.

Figure 6:
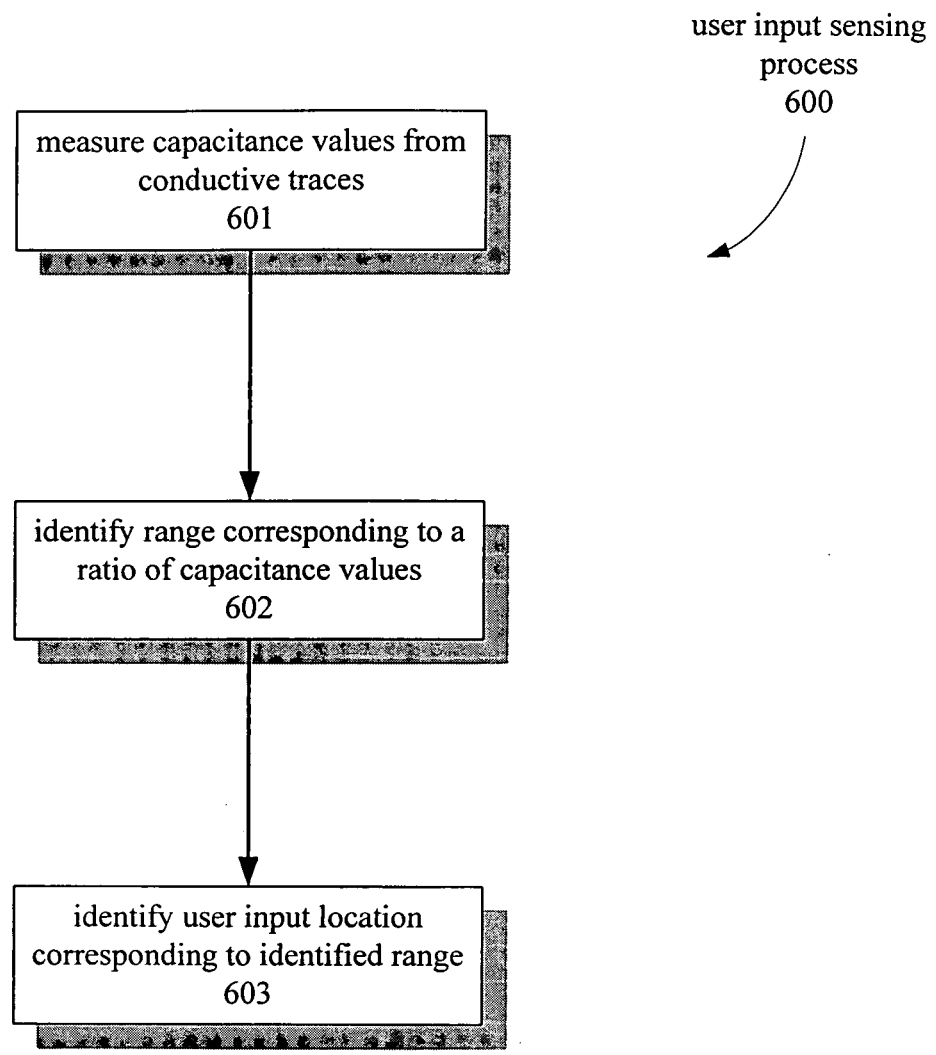
FIG. 6 is a flow chart illustrating a process for determining a user input location on a slider-based capacitive sensor.

FIG. 6 illustrates a process for determining a location of a user input on a capacitive sensor according to one embodiment of the present invention. In one embodiment, user input sensing process 600 may be used with capacitive sensor 300. In other embodiments, user input sensing process 600 may be used with other types of capacitive sensors such as capacitive sensor 310 or capacitive sensor 400. In one embodiment, user input sensing process 600 is executed by processing device 210.

User input sensing process 600 begins at process block 601, where capacitance values are measured. In one embodiment where user input sensing process 600 is used with capacitive sensor 300, execution of process block 601 includes measuring capacitance values for each of conductive traces 301 and 302. In one embodiment, the capacitance values may be measured using a capacitance sensing algorithm such as Capacitance Successive Approximation (CSA) or Capacitance Switch Relaxation oscillator (CSR). Using an algorithm such as CSA, for example, may produce capacitance measurements represented by count values. Following completion of process block 601, execution proceeds to process block 602.

In process block 602, a ratio range containing a ratio of the measured capacitance values is identified. In one embodiment where user input sensing process 600 is executed by processing device 210, a set of ratio ranges may be stored in a memory such as RAM 205 or program flash 204. A ratio range may be defined by an upper limit and a lower limit, or a ratio range may be defined by only one of an upper limit or a lower limit. In one embodiment, the limits defining a ratio range can be expressed in terms of ratios between capacitance measurements. For example, in an embodiment where capacitance measurements are represented by count values, a ratio range may apply to a ratio C1/C2 between a first count value C1 and a second count value C2. The ratio range may be defined as containing C1/C2 if C1/C2 is less than, for example, 3/1. A ratio range having both an upper and a lower limit may be defined as containing C1/C2, for example, if C1/C2 is less than 2/3 and greater than or equal to 1/3.

Following process block 602 is process block 603, in which a user input location is identified that corresponds to the ratio range containing the ratio between the capacitance measurements. In one embodiment, the limits of each ratio range may be chosen to correspond to capacitance ratios that in turn correspond to the boundaries of buttons such as buttons 321, 322, 323, 324, and 325. For example, in one embodiment, a user input at button 321 results in a capacitance change at conductive trace 301 and a capacitance change at conductive trace 302. The capacitance changes result in count values C1 and C2, respectively. For button 321 as depicted in FIG. 3A, C1 will be much greater than C2 because the surface area of conductive trace 301 is much greater than the surface area of conductive trace 302 within the boundaries of button 321. Thus, if C1/C2 falls within the high range of ratios corresponding to the limits of button 321, a processing device 210 may be able to determine that an input was received at button 321. If C1/C2 is outside of this range, processing device 210 may determine that an input was received at a different button. The location of an input applied to a different button may be similarly determined by identifying a ratio range into which the ratio C1/C2 falls, then identifying a button location corresponding to that ratio range.

Figure 7:
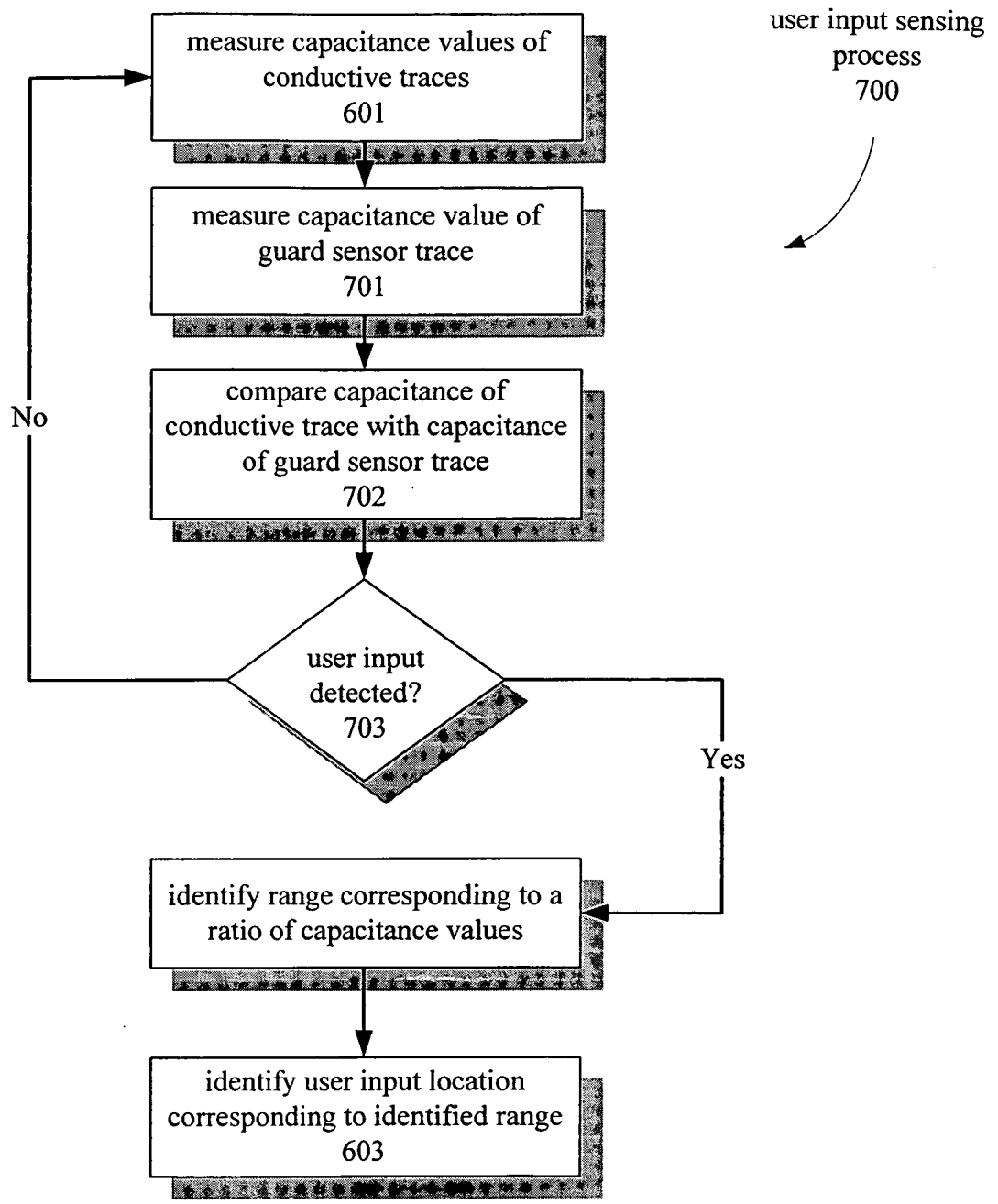
FIG. 7 is a flow chart illustrating a process for determining the presence and location of a user input on a slider-based capacitive sensor with a guard trace.

FIG. 7 is a flow chart illustrating a process according to one embodiment of the invention for determining whether a change in capacitance detected by a capacitive sensor is the result of an intentional user input, then determining the location of the input if the input is determined to be intentional.

As with user input sensing process 600, user input sensing process 700 begins with process block 601, where capacitance values of conductive traces such as conductive traces 301 and 302 are measured. Execution then proceeds to process block 701, where the capacitance value of a guard sensor trace such as guard sensor trace 303 is measured. As with the capacitance values of the conductive traces, the capacitance value of the guard sensor trace may be measured using Capacitance Successive Approximation (CSA), Capacitance Switch Relaxation oscillator (CSR) or some other capacitance sensing algorithm. At process block 702, the measured capacitance values of the guard sensor trace may be compared with the measured capacitance values of one or both of the conductive traces. For example, in an embodiment where user input sensing process 700 is used with capacitive sensor 300, capacitance measurements from conductive traces 301 and 302 may be compared with a capacitance measurement from guard sensor trace 303. In one embodiment, a processing device such as processing device 210 that is connected to capacitive sensor 300 may determine whether a user action detected by capacitive sensor 300 was intended to be an input by determining whether the change in capacitance of the guard sensor trace 303 is greater than the change in capacitance of one or both of the conductive traces 301 and 302. For example, if the capacitance change of the guard sensor trace 303 is higher than the capacitance change of the conductive traces 301 and 302, processing device 210 may determine that no intentional input was present. In one embodiment, this may indicate that the conductive object being detected by the capacitive sensor 300 is not centered over one of the buttons, such as button 321, for example.

At decision block 703, execution proceeds to either process block 601 or process block 602 depending on whether or not an intentional user input was detected through the execution of process blocks 601, 701, and 702. If a user input is not detected, then execution returns to process block 601 where capacitance values of the conductive traces are measured. Thus, blocks 601, 701, 702, and 703 are repeated until a user input is detected. If a user input is detected, execution proceeds from decision block 703 to process block 602. At process block 602, a ratio range is identified that contains a ratio of the measured capacitance values, as previously described. The location of the user input is then determined by correlating the identified ratio range to a button location on the capacitive sensor, as provided by process block 603.

Figure 8:
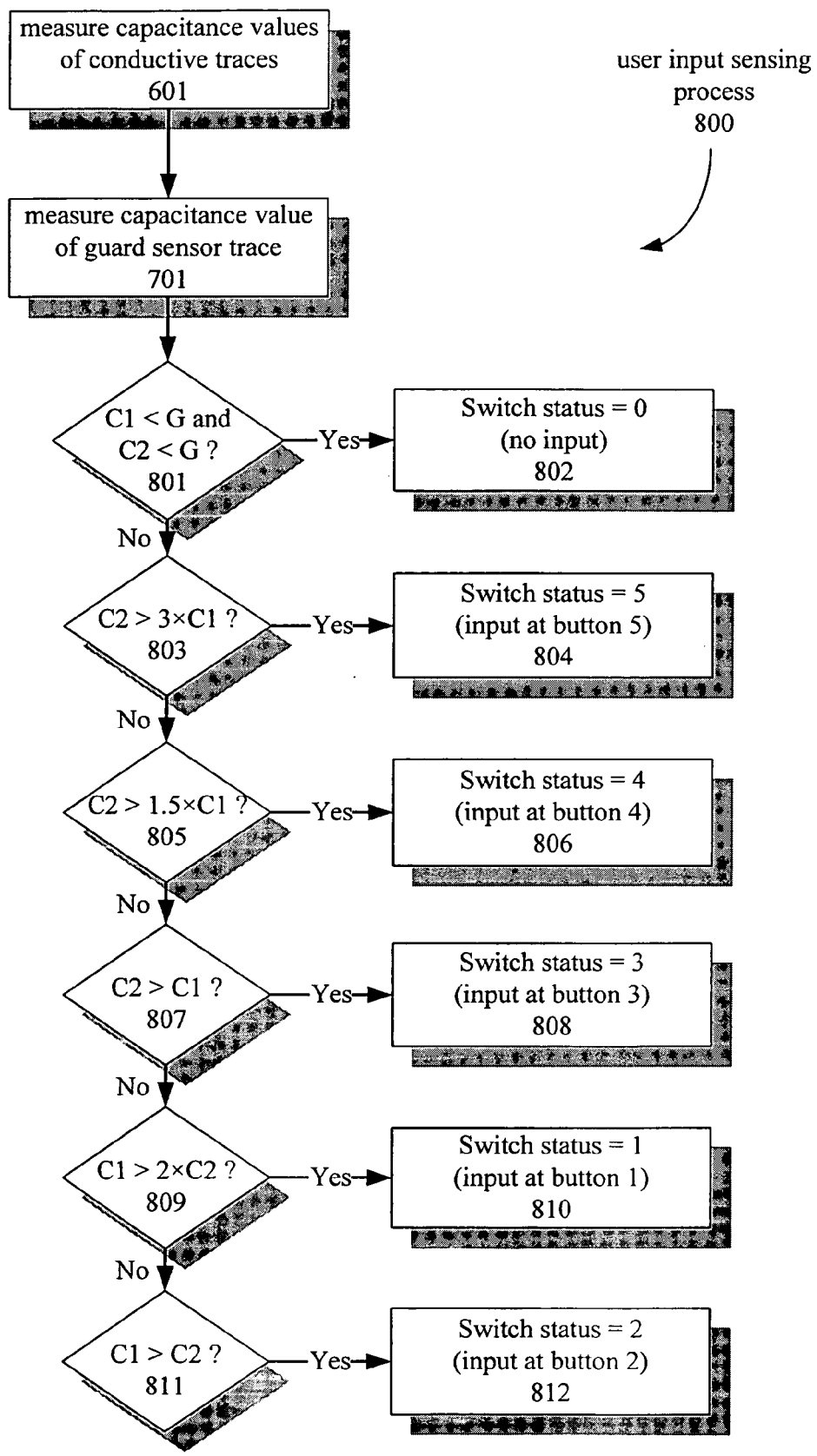
FIG. 8 is a flow chart illustrating an algorithm for determining a user input location based on ratios between measured capacitance values.

FIG. 8 is a flow chart illustrating an algorithm for detecting the presence and location of a user input according to one embodiment of the invention. Similarly to user input sensing process 700, user input sensing process 800 begins with process block 601, where capacitance values of conductive traces such as conductive traces 301 and 302 are measured. In one embodiment, a capacitive sensing algorithm may be used to measure the capacitance values. The capacitive sensing algorithm may represent the capacitance values as count values. For example, the count values C1 and C2 may be measured from conductive traces 301 and 302, respectively. Execution then proceeds to process block 701, where a capacitance value is measured from a guard sensor trace such as guard sensor trace 303. The capacitance value of the guard sensor trace may also be measured as a count value. For example, count value G may be measured from the guard sensor trace 303. Following the completion of process block 701, execution proceeds to decision block 801. In one embodiment, the functions of blocks 702 and 703 of user input sensing process 700 are performed by decision block 801 and process block 802. These blocks perform the function of comparing the measured capacitance values of the conductive traces with the measured capacitance value of the guard sensor trace. In one embodiment, at decision block 801, a processing device such as processing device 210 may evaluate whether count values C1 and C2, measured from the conductive traces 301 and 302, are both less than count value G, measured from the guard sensor trace 303. If C1 and C2 are both less than G, then processing device 210 may determine that an input has not been received. Otherwise, processing device 210 may determine that an input has been received.

If an input has been received, execution proceeds from decision block 801 to decision block 803. In one embodiment, decision blocks 803, 805, 807, 809, and 811 together perform a similar function as process block 602, where a ratio range is identified that corresponds to a ratio of the measured capacitance values. As illustrated in FIG. 8, each ratio range is evaluated using an inequality statement, with one ratio range being evaluated in each of decision blocks 803, 805, 807, 809, and 811. Although ratio ranges are evaluated using inequality statements in the illustrated embodiment, other methods besides inequality statements may be used to produce the same logical result. For instance, in one embodiment, a ratio of the capacitance values may first be computed, then compared to the limits of the ratio range. When a ratio range is identified, execution proceeds from one of the decision blocks 803, 805, 807, 809, or 811 to one of the process blocks 804, 806, 808, 810, or 812. Process blocks 804, 806, 808, 810, and 812 together are functionally analogous to process block 603, which determines a user input location that corresponds to the identified ratio range.

In one embodiment, evaluation of the ratio ranges in order to determine a location of the user input begins at decision block 803. In one embodiment where C1 and C2 are the count values representing capacitance measurements at conductive traces 301 and 302, a processing device such as processing device 210 may evaluate at decision block 803 whether C2 is greater than three times C1. If so, then execution proceeds to process block 804, which identifies, for example, button location 5 corresponding to button 325 on capacitive sensor 300 as the location of the user input.

If C2 is not greater than three times C1, then execution proceeds to decision block 805. At decision block 805, processing device 210 may evaluate whether C2 is greater than 1.5 times C1. If so, then execution proceeds to process block 806, which identifies, for example, button location 4 corresponding to button 324 on capacitive sensor 300 as the location of the user input.

If C2 is not greater than 1.5 times C1, then execution proceeds to decision block 807. At decision block 807, processing device 210 may evaluate whether C2 is greater than C1. If so, then execution proceeds to process block 808, which identifies, for example, button location 3 corresponding to button 323 on capacitive sensor 300 as the location of the user input.

If C2 is not greater than C1, then execution proceeds to decision block 809. At decision block 809, processing device 210 may evaluate whether C1 is greater than two times C2. If so, then execution proceeds to process block 810, which identifies, for example, button location 1 corresponding to button 321 on capacitive sensor 300 as the location of the user input.

If C1 is not greater than two times C2, then execution proceeds to decision block 811. At decision block 811, processing device 210 may evaluate whether C1 is greater than C2. If so, then execution proceeds to process block 812, which identifies, for example, button location 2 corresponding to button 322 on capacitive sensor 300 as the location of the user input. Having identified the location of the user input, processing device 210 may in one embodiment take an action such as performing a function associated with the identified button location.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a computer. The computer-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   measuring a capacitance value associated with each of a plurality of conductive traces, each of the plurality of conductive traces having a first end and a second end, wherein at least one of the plurality of conductive traces has a greater surface area near the first end than near the second end;
   measuring a capacitance value associated with a guard sensor trace;
   determining whether to process a detected user action as user input based on a comparison between the capacitance value associated with the guard sensor trace and a capacitance value associated with at least one of the plurality of conductive traces;
   processing the user action as the user input, the processing including:
      determining that a ratio from the capacitance values associated with each of the plurality of conductive traces is within one of a plurality of ratio ranges stored in a memory; and
      identifying a location of the user input on the plurality of conductive traces, wherein the location corresponds to the one ratio range of the plurality of ratio ranges that the ratio is determined to be within.

2. The method according to claim 1, wherein at least a portion of the guard sensor trace is positioned alongside at least one conductive trace of the plurality of conductive traces.

3. The method according to claim 1, further comprising:
   determining a first count value from a capacitance associated with a first tapered conductive trace of the plurality of conductive traces;
   determining a second count value from a capacitance associated with a second tapered conductive trace of the plurality of conductive traces;
   determining a guard count value from a capacitance associated with the guard sensor trace;
   determining a presence of a user input if the guard count value is not greater than half of the first count value and the guard count value is not greater than half of the second count value;
   identifying a first button position as a location of the user input if the user input is determined to be present and the first count value is greater than two times the second count value;
   identifying a second button position as the location of the user input if the user input is determined to be present, the first count value is greater than the second count value, and the first count value is not greater than two times the second count value;
   identifying a third button position as the location of the user input if the user input is determined to be present, the first count value is not less than two-thirds of the second count value, and the first count value is less than the second count value;
   identifying a fourth button position as the location of the user input if the user input is determined to be present, the first count value is not less than one-third of the second count value, and the first count value is less than two-thirds of the second count value; and identifying a fifth button position as the location of the user input if the user input is determined to be present and the first count value is less than one-third of the second count value.

4. The method according to claim 1, wherein at least one ratio range from the plurality of ratio ranges includes only one of an upper limit or a lower limit.

5. The method according to claim 1, wherein the plurality of conductive traces includes a first conductive trace and a second conductive trace including two subtraces, wherein the first conductive trace is interleaved between the two subtraces of the second conductive trace and the first end of the first conductive trace is adjacent to the second end of the second conductive trace.

6. The method according to claim 1, wherein the plurality of conductive traces includes a first conductive trace and a second conductive trace, wherein the first conductive trace is positioned alongside the second conductive trace such that the first end of the first conductive trace is adjacent to the second end of the second conductive trace.

7. The method according to claim 1, wherein at least one of the plurality of conductive traces is curved along a circumference of a circle.

8. The method according to claim 1, wherein at least one of the plurality of conductive traces is made from a conductive polymer film.

9. An apparatus comprising:
   a processor configured to receive capacitance values measured from each of a plurality of conductive traces and a guard sensor trace, each of the plurality of conductive traces having a first end and a second end, wherein at least one of the plurality of conductive traces has a greater surface area near the first end than near the second end, wherein the processor is configured to determine whether to process a detected user action as user input based on a comparison between the capacitance value associated with the guard sensor trace and a capacitance value associated with at least one of the plurality of conductive traces, wherein the processor is further configured to determine whether a ratio from the received capacitance values from each of the plurality of conductive traces is within one of a plurality of ratio ranges stored in a memory, the processor further configured to use the one of the plurality of ratio ranges to identify the user input location on the plurality of conductive traces, wherein the user input location corresponds with the one ratio range of the plurality of ratio ranges that the ratio from the received capacitance values is determined to be within.

10. The apparatus according to claim 9, wherein the guard sensor trace is positioned alongside at least one conductive trace of the plurality of conductive traces.

11. The apparatus according to claim 9 wherein the guard sensor trace at least partially surrounds at least one conductive trace of the plurality of conductive traces.

12. The apparatus according to claim 11, wherein said processor is further configured to determine a first count value from a capacitance associated with a first tapered conductive trace of the plurality of conductive traces, determine a second count value from a capacitance associated with a second tapered conductive trace of the plurality of conductive traces, and determine a guard count value from a capacitance associated with the guard sensor trace, the processor further configured to determine a presence of a user input if the guard count value is not greater than half of the first count value and the guard count value is not greater than half of the second count value, the processor further configured to identify a first button position as a location of the user input if the user input is determined to be present and the first count value is greater than two times the second count value, the processor further configured to identify a second button position as the location of the user input if the user input is determined to be present, the first count value is greater than the second count value, and the first count value is not greater than two times the second count value, the processor further configured to identify a third button position as the location of the user input if the user input is determined to be present, the first count value is not less than two-thirds of the second count value, and the first count value is less than the second count value, the processor further configured to identify a fourth button position as the location of the user input if the user input is determined to be present, the first count value is not less than one-third of the second count value, and the first count value is less than two-thirds of the second count value, the processor further configured to identify a fifth button position as the location of the user input if the user input is determined to be present and the first count value is less than one-third of the second count value.

13. The apparatus according to claim 9, wherein at least one ratio range from the plurality of ratio ranges includes only one of an upper limit or a lower limit.

14. The apparatus according to claim 9, wherein the plurality of conductive traces includes a first conductive trace and a second conductive trace including two sub traces, wherein the first conductive trace is interleaved between the two subtraces of the second conductive trace and the first end of the first conductive trace is adjacent to the second end of the second conductive trace.

15. The apparatus according to claim 9, wherein the plurality of conductive traces includes a first conductive trace and a second conductive trace, wherein the first conductive trace is positioned alongside the second conductive trace such that the first end of the first conductive trace is adjacent to the second end of the second conductive trace.

16. The apparatus according to claim 9, wherein at least one of the plurality of conductive traces is made from a conductive polymer film.

17. A method comprising:

determining that a detected action is capacitive sensor array input;

detecting a presence of an input on one of a plurality of input locations on a capacitive sensor array comprising a plurality of slider sensor elements and a guard sensor element, wherein determining that the detected action is capacitive sensor array input is based on a comparison between a capacitance value associated with the guard sensor element and a capacitance value associated with at least one of the plurality of slider sensor elements; and discriminating among the plurality of input locations on the capacitive sensor array, wherein each of the plurality of input locations corresponds to a different capacitance ratio range stored in a memory.

18. The method according to claim 17, wherein detecting the presence of the input includes determining a plurality of measured capacitance values from the capacitive sensor array and associating one of the different capacitance ratio values with the one of the plurality of input locations.

* * * * *